United States Patent
Miryara et al.

[11] Patent Number: 6,063,736
[45] Date of Patent: May 16, 2000

[54] OXIDE SUPERCONDUCTOR OF HIGH CRITICAL CURRENT DENSITY

[75] Inventors: Muralidar Miryara; Masato Murakami, both of Tokyo; Koji Segawa, Morioka; Koichi Kamada, Morioka; Takashi Saitho, Morioka, all of Japan

[73] Assignees: Superconductivity Research Laboratory, Tokyo; Iwate Prefectual Government, Morioka, both of Japan

[21] Appl. No.: 09/345,147

[22] Filed: Jun. 30, 1999

[30] Foreign Application Priority Data

Jul. 1, 1998 [JP] Japan .................................. 10-186629

[51] Int. Cl.⁷ ............................ C04B 35/50; C04B 35/45
[52] U.S. Cl. .......................... 505/126; 505/124; 505/778
[58] Field of Search ...................................... 505/124, 125, 505/126, 778, 779

[56] References Cited

U.S. PATENT DOCUMENTS 5,849,667  12/1998  Murakami et al. ...................... 505/125
5,968,878  10/1999  Kojo et al. .............................. 505/450
5,981,442  11/1999  Yanagi et al. ........................... 505/126

*Primary Examiner*—Mark Kopec
*Attorney, Agent, or Firm*—Flynn, Thiel, Boutell & Tanis, P.C.

[57] ABSTRACT

There is provided RE-Ba-Cu-O oxide bulk superconductors in which considerably high critical current density is obtained at relatively high temperature. In the present RE-Ba-Cu-O bulk superconductors, RE is a combination of two or more elements selected from La, Nd, Sm, Eu and Gd, at least one of them being La, Nd and Sm and the remainder being Eu or Gd, in which a parent phase thereof comprises a $RE_{1+x}Ba_{2-x}Cu_3O_y$ crystal wherein $-0.1<x<0.2$ and $6.7<y<7.1$, and 5 to 50% by volume of a $RE_2Ba_2CuO_5$ fine dispersed phase having partide size of 0.01 to 0.5 $\mu$m. Preferably, a total amount of Eu and Gd in the RE site is 40% by weight or less, while a slight amount of Pt may be added. As a result, the critical current density at liquid nitrogen temperature can be improved to 10,000 A/cm² or more under a condition where a magnetic field of 3T is impressed parallel to c axis of the crystal.

6 Claims, 1 Drawing Sheet

OXIDE SUPERCONDUCTOR OF HIGH CRITICAL CURRENT DENSITY

BACKGROUND OF THE INVENTION

1. Field of the Invention

The present invention relates to RE-Ba-Cu-O type oxide superconductors exhibiting high critical current density at liquid nitrogen temperature, wherein RE means a combination of at least two elements selected from Nd, Sm, Eu, Gd, Y, Ho and Dy.

2. Description of the Related Art

Bulk process technology for preparing RE-Ba-Cu-O type crystals (RE is rare earth elements) has been considerably improved, which makes it possible to produce large RE-Ba-Cu-O oxide bulk superconductors having high critical current density and shifted crystal orientation.

Strong electromagnetic force can be generated by an interaction between such bulk superconductors and outer magnetic field under a contactless condition, which is widely applicable to a magnetic bearing and a contactless pump as well as a superconductive flywheel type electric power storage unit using low-loss magnetic bearings.

On the other hand, a large magnetic field can be trapped by the above mentioned superconductors due to considerable possibility of a pinning effect, and according to resent reports, there has been prepared bulk superconductors of about 1 T at liquid nitrogen temperature (77 K) and higher T values such as 10 T at a lower temperature of 45 K. As RE-Ba-Cu-O bulk superconductors trap a large magnetic field as described above, such superconductors in the same shape and size as a permanent magnet can generate much higher magnetic field than the magnet and attract attention as a novel functional material.

While RE-Ba-Cu-O type superconductors have improved critical current properties at relatively high temperature but difficulty in working characteristics, the bulk superconductors are tried to form into wires and tapes so as to widen application thereof.

It is the most desirable, however, to increase critical current density at higher temperature in a higher magnetic field in order to widen application of the bulk superconductors. For example, a magnetic field more than 5 T is necessary to use such superconductors as a magnet for magnetic levitation train which is now practically tested.

Further, an economic point of view is also important. From such a viewpoint, it is preferable to attain much higher magnetic field at higher temperature, if possible, at liquid nitrogen temperature.

As RE-Ba-Cu-O bulk superconductors tend to result in a typical pinning effect as described above, it is effective to homogeneously and finely disperse "normal conductive deposit", etc. which functions as a pinning center in the bulk superconductors to increase critical current density.

Conventional large sized RE-Ba-Cu-O bulk superconductors of expected high performance have been generally prepared by a "melting process". In this process, a RE-Ba-Cu-O superconductor composition as a starting composition is heated to form a semi-molten state, then seeded with a suitable seed crystal and slowly cooled to prepare a bulk material of shifted crystal orientation. It is also a general practice to provide temperature gradient to superconductors during a solidification step.

The "melting process" has been originally developed as technical method which is conducted in the air. Even now, when Y-, Ho- or Dy-containing superconductors (i.e., RE-Ba-Cu-O type superconductors wherein RE is Y, Ho or Dy) are prepared, a corresponding starting composition is generally subjected to melt-solidification in the air, while in the case of La-, Nd-, Sm-, Eu- or Gd-containing superconductors (i.e., RE-Ba-Cu-O superconductor wherein RE is La, Nd, Sm, Eu or Gd), melt-solidification of a starting composition is mostly carried out under a condition of lower oxygen partial pressure. The reason why is based on the following information. It has been found that "a cluster of slightly higher RE concentration and lower critical temperature compared with a parent phase" is spontaneously and finely dispersed in the parent phase to greatly raise critical current density, when RE-Ba-Cu-O superconductors having a solid solution composition of $RE_{1+x}Ba_{2-x}Cu_3O_y$, wherein RE is La, Nd, Sm or Gd, are molten and grown under a condition of lower oxygen partial pressure.

In a resent "melting process" in which a RE-Ba-Cu-O bulk superconductor is prepared, wherein RE is La, Nd, Sm, Eu, Gd, Y, Ho or Dy, it has been found that, when a starting composition is melt-solidified, an initial composition thereof is set in advance to a $RE_2BaCuO_5$ phase (so-called RE211 phase)-rich side, or to a $RE_4Ba_2Cu_2O_{10}$ phase (so-called RE422 phase)-rich side in the case of RE=La or Nd, to successfully yield structure in which the RE211 or RE422 phase is finely dispersed in a superconductive $REBa_2Cu_3O_y$. (RE123) phase. Using the above mentioned structure control technique, it has been also possible to prepare superconductors in which relatively higher critical current density is achieved at liquid nitrogen temperature.

When RE-Ba-Cu-O bulk superconductor are prepared, wherein RE is La, Nd, Sm Eu or Gd, it is expected to obtain a more preferable result because a cluster of higher RE concentration and the RE211 phase coexist in a parent phase of this system, both of which function as a pinning center so that the critical current density is increased.

In practice, however, the magnetic field dependence of critical current density at liquid nitrogen temperature is unexpectedly high because of larger particle size of the RE211 phase in the order of at least 2 to 10 $\mu$m. As a result, an improvement in the critical current density can be achieved in the side of lower magnetic field because of the above mentioned function as a pinning center, while such an improvement is not so remarkable in the side of higher magnetic field and, in particular, when a magnetic field is impressed to a crystal parallel to the c axis thereof, the critical current density is considerably decreased in a magnetic field over 3T.

As described above, a contribution of the duster is essential for an improvement in the critical current density in the side of higher magnetic field. However, even if the duster contributes to the critical current density, such a contribution is not sufficient technically to provide "a large RE-Ba-Cu-O bulk superconductor" in which a high magnetic field enough to apply to a magnet for magnetic levitation train, etc. is obtained at relatively high temperature.

SUMMARY OF THE INVENTION

Accordingly, it is an object of the present invention to establish a means for stably providing "RE-Ba-Cu-O bulk superconductors of sufficiently high critical current density at relatively high temperature" to improve properties of a magnet for magnetic levitation train, etc.

As a result of inventors' eager investigation to achieve the above mentioned object, the following novel information has been found. "In RE-Ba-Cu-O bulk superconductors in which La, Nd, Sm, Eu or Gd is used as a RE(rare earth element) site, when the RE site is a combination of two kinds or more of rare earth elements and at least one of them is Eu or Gd, a very finely dispersing phase of RE211 is formed in a RE123 superconductive parent phase during production of the bulk superconductor by, for example, the melting process, etc. The finely dispersed phase functions as an effective pinning center, thereby very high critical current density being obtained even in a higher magnetic field without decreasing the critical temperature".

It has been confirmed that "the RE211 phase of 0.01 to 0.5 μm in particle size" can be finely dispersed with increased reproducibility in the RE123 superconductive parent phase by optimizing a process of the above mentioned RE-Ba-Cu-O bulk superconductors, while higher critical current density is stably achieved in the RE-Ba-Cu-O bulk superconductors under a condition of high temperature and high magnetic field and even when a magnetic field is impressed to parallel to the c axis of the superconductive crystal.

Further, when a slight amount of Pt is added to the RE-Ba-Cu-O bulk superconductors, Pt greatly contributes to fine dispersion of the dispersed RE211 phase in the RE123 superconductive parent phase, thereby more stably forming a finely dispersed phase and stabilizing a function thereof as a pinning center, which is quite advantageous to obtain high critical current density.

The present invention is based on the above mentioned information and other fact conformed therefrom, and provides oxide superconductors as in the following.

1. RE-Ba-Cu-O oxide bulk superconductors of high critical current density wherein RE is a combination of two or more elements selected from La, Nd, Sm, Eu or Gd and at least one of them is La, Nd or Sm and the other is Eu or Gd, in which a parent phase thereof comprises a $RE_{1+x}Ba_{2-x}Cu_3O_y$ crystal wherein $-0.1<x<0.2$ and $6.7<y<7.1$, and 5 to 50% by volume of a $RE_2Ba_2CuO_5$ fine dispersed phase having particle size of 0.01 to 0.5 μm.

2. Oxide superconductors of high critical current density described in the item 1 in which a $RE_2Ba_2CuO_5$ fine dispersed phase comprises a fine crystal of $Gd_2BaCuO_5$, $Eu_2BaCuO_5$ or $(Eu, Gd)_2BaCuO_5$.

3. Oxide superconductors of high critical current density described in the item 1 or 2 in which a RE site of RE-Ba-Cu-O bulk superconductors is a combination of three or more elements selected from La, Nd, Sm Eu or Gd.

4. Oxide superconductors of high critical current density described in the item 3 in which content of one or both of Eu and Gd in a RE site is 40% by volume or less.

5. Oxide superconductors of high critical current density described in the items 1 to 4 which further comprises 0.1 to 2% by weight of Pt.

6. Oxide superconductors of high critical current density described in the items 1 to 5 in which critical current density thereof at liquid nitrogen temperature is 10,000 A/cm$^2$ or more under a condition where a magnetic field of 3T is impressed parallel to c axis of a crystal.

As has been described above, the most characteristic feature of the present invention is that "in RE-Ba-Cu-O oxide type bulk superconductors of high critical current density in which a RE site is La, Nd, Sm, Eu and Gd, the RE site is 'a combination of two or more of rare earth elements (RE)', at least one of them being La, Nd and Sm and at least one of the remainder being Eu or Gd, while a parent phase comprises a $RE_{1+x}Ba_{2-x}Cu_3O_y$ crystal, wherein $-0.1<x<0.2$ and $6.7<y<7.1$, and 5 to 50% by volume of a $RE_2Ba_2CuO_5$ fine dispersed phase having particle size of 0.01 to 0.5 μm, thereby high critical current density being achieved under a condition of high temperature and high magnetic field". The following is regarded as a reason why the finely dispersed RE211 phase is formed in the RE123 phase when the RE site of RE-Ba-Cu-O bulk superconductors is "a combination of two or more rare earth elements (RE)" and at least one of the rare earth elements is Eu or Gd.

When the RE site of RE-Ba-Cu-O bulk superconductors is "a combination of two or more rare earth elements (RE)" and at least one of the rare earth elements is Eu or Gd, a Gd211 or Eu211 phase which has lower peritectic decomposition temperature and lower solubility in a liquid phase is very finely and homogeneously dispersed in the liquid phase and solidified as it is, because peritectic decomposition temperatures of the RE123 and RE211 phases are dependent on a kind of RE and, in addition, RE concentration in the liquid phase of semi-molten state is different when bulk superconductors are prepared by the melting process, etc. That is to say, in a mixed system of plural rare earth elements, a RE211 phase of relatively low decomposition temperature is crystallized as a whole in a finely and homogeneously dispersed state, and the thus finely dispersed RE211 phase effectively functions as a pinning center to achieve high critical current density.

It is preferable to use a combination of three or more rare earth elements (RE) as a RE site. In this manner, stable formation of the finely and homogeneously dispersed RE211 phase is further improved, which permits more stable production of high performance oxide superconductors.

It has been also confirmed that considerably high critical current density such as, for example, 60,000 A/cm$^2$ at 3T can be obtained in the present RE-Ba-Cu-O superconductors by finely dispersing the RE211 phase under a condition where a magnetic field is impressed parallel to the c axis at liquid nitrogen temperature.

It is preferable to use a $Gd_2BaCuO_5$—, $Eu_2BaCuO_5$—or $(Eu, Gd)_2BaCuO_5$ phase as the RE211 dispersed phase ($RE_2BaCuO_5$ phase). The reason why is that these phases have low peritectic decomposition temperature and low solubility in a liquid phase, which makes it easy to finely disperse in the RE123 parent phase ($RE_{1+x}Ba_{2-x}Cu_3O_y$ parent phase) and to achieve high performance.

It should be noted, however, that total content of Eu or Gd, or Eu and Gd in the RE site of RE-Ba-Cu-O bulk superconductor does not exceed 40% by volume. If the total content exceeds 40% by volume, the RE211 phase in the RE-Ba-Cu-O bulk superconductors is not finely enough dispersed to form desired particle size, thereby decreasing critical current density thereof.

As described above, particle size of the $RE_2BaCuO_5$ (or RE123) dispersed phase in the $RE_{1+x}Ba_{2-x}Cu_3O_y$ (or RE123) parent phase is limited to a range of 0.01 to 0.5 μm. If the particle size of the dispersed phase in the bulk superconductor deviates from the above mentioned range, a function thereof as a pinning center is decreased to yield undesirable properties.

Further, if the content of the $RE_2BaCuO_5$ dispersed phase having 0.01 to 0.5 μm in particle size deviates from a range of 5 to 50% by volume, an effect of improvement in critical current density is decreased to yield undesirable properties. Accordingly, content of the $RE_2BaCuO_5$ dispersed phase having 0.01 to 0.5 μm in particle size is preferably in the range of 5 to 50% by volume.

In order to keep the particle size and content of the $RE_2BaCuO_5$ phase dispersed in the $RE_{1+x}Ba_{2-x}Cu_3O_y$ parent phase within the above mentioned range, a combination of rare earth elements contained in the RE site, a solidification and growth condition of the RE-Ba-Cu-O bulk superconductors, etc. may be controlled.

Furthermore, when a slight amount of Pt is added to the RE-Ba-Cu-O bulk superconductors, a finely dispersing effect of the RE211 phase is stabilized, thereby easily yielding high critical current density due to a function as a pinning center of the finely dispersed phase. When the Pt content in the bulk superconductors is 0.1% by weight or less, the finely dispersing effect of the RE211 phase is not sufficient, on the other hand, when the Pt content exceeds 2% by weight, properties (critical current density) of the bulk superconductors should be reduced.

DESCRIPTION OF THE PREFERRED EMBODIMENT

Figure 1:
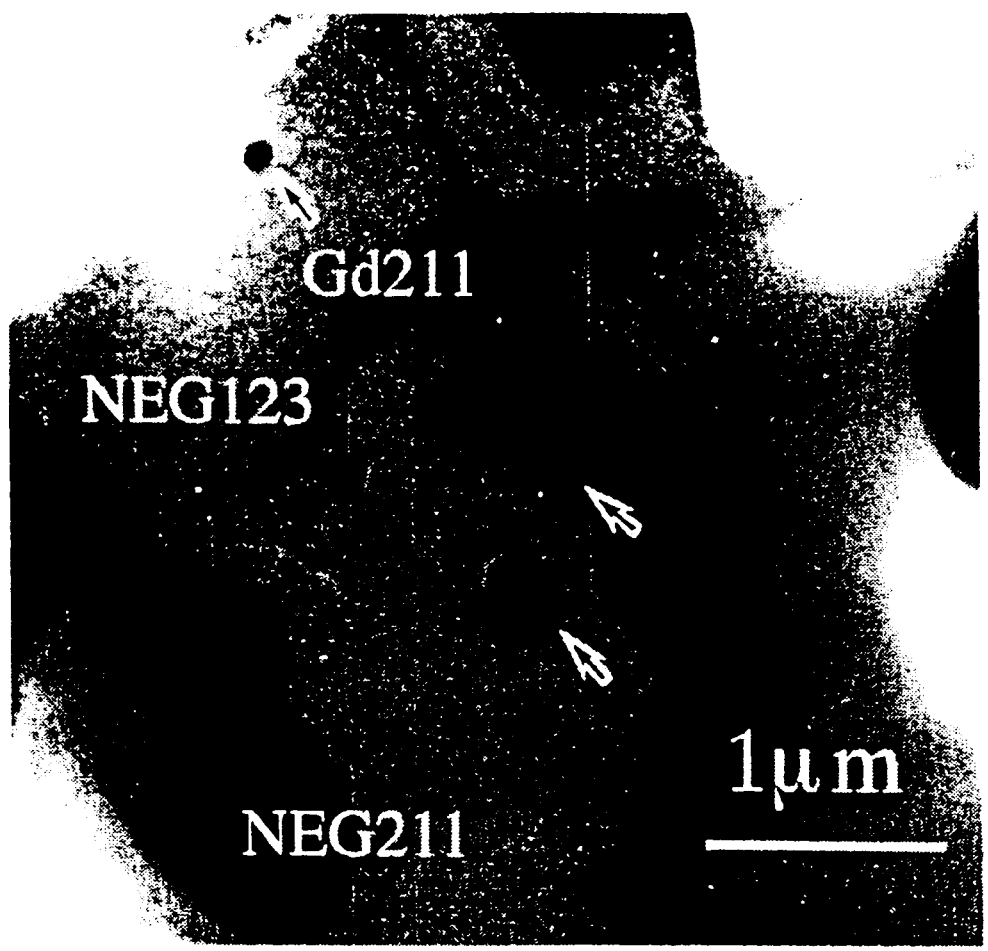
FIG. 1 is a transmission electron micrograph of a RE-Ba-Cu-O bulk superconductor prepared by Example 1.

The present invention will be described in detail in the following.

EXAMPLE 1

Starting powders of $Nd_2O_3$, $Eu_2O_3$, $Gd_2O_3$, $BaCO_3$ and CuO were weighed and mixed in the ratio of (Nd+Eu+Gd):Ba:Cu=1.8:2.4:3.4 and ND:Sm:Gd=1:1:1, followed by addition of 0.4% by weight of Pt and calcination at temperature of 950° C. for 8 hours in an 1%—oxygen atmosphere.

Then, the calcined material was further ground and mixed, and similar calcination as described above was repeated three times to form a pellet of 3 cm in diameter and 2 cm in height.

A single crystal of MgO was put on the thus formed pellet, heated up to temperature of 1,090° C. for 2 hours in an 1%—oxygen atmosphere, after keeping this condition for 20 minutes, cooled to temperature of 1,020° C. at a cooling rate of 5° C./hr., and then slowly cooled to 900° C. at a cooling rate of 0.5° C. to solidify and grow a superconductive phase.

The pellet was subsequently subjected to an oxygen treatment by slowly cooling it from temperature of 600° C. to 300° C. for 300 hours in a pure oxygen flow.

A small cubic sample of 2 mm×2 mm×1 mm was cut out from the pellet after the oxygen treatment and subjected to determination of critical current density by means of a superconductive quantum interference fluxmeter. The critical temperature was 94.5 K, while the critical current density was 72,000 A/cm$^2$ under a condition where a magnetic field of 3T was impressed parallel to the c axis at liquid nitrogen temperature.

After polishing the surface of the specimen (small cubic sample), average particle size of RE211 phase was determined by scanning electron microscopy to obtain a value of 0.11 μm. This value is one tenth or less than that of a conventionally prepared Y-Ba-Cu-O type bulk superconductor.

Further, as results of transmission electron microscopy and energy dispersive X-ray spectrometry of the sample, it was confirmed that the fine RE211 phase principally comprises Gd211 as shown in FIG. 1.

In FIG. 1, "NEG123" designates "a 123 phase where a RE site comprises Nd, Eu and Gd", while "NEG211" designates "a 211 phase where a RE phase comprises Nd, Eu and Gd".

EXAMPLE 2

Starting powders of $Nd_2O_3$, $Sm_2O_3$, $Gd_2O_3$, $BaCO_3$ and CuO were weighed and mixed in the ratio of (Nd+Sm+Gd):Ba:Cu=1.8:2.4:3.4 and ND:Sm:Gd=1:1:1, followed by addition of 0.4% by weight of Pt and calcination at temperature of 900° C. for 8 hours in an 1%—oxygen atmosphere.

Then, the calcined material was further ground and mixed, and similar calcination as described above was repeated three times to form a pellet of 3 cm in diameter and 2 cm in height.

A single crystal of MgO was put on the thus formed pellet, heated up to temperature of 1,100° C. for 2 hours in an 1%—oxygen atmosphere, after keeping this condition for 20 minutes, cooled to temperature of 1,030° C. at a cooling rate of 5° C./hr., and then slowly cooled to 900° C. at a cooling rate of 0.5° C. to solidify and grow a superconductive phase.

The pellet was subsequently subjected to an oxygen treatment by slowly cooling it from temperature of 600° C. to 300° C. for 300 hours in a pure oxygen flow.

A small cubic sample of 2 mm×2 mm×1 mm was cut out from the pellet after the oxygen treatment and subjected to determination of critical current density by means of a superconductive quantum interference fluxmeter. The critical temperature was 94 K, while the critical current density was 65,000 A/cm$^2$ under a condition where a magnetic field of 3T was impressed parallel to the c axis at liquid nitrogen temperature.

After polishing the surface of the specimen (small cubic sample), average particle size of RE211 phase was determined by scanning electron microscopy to obtain a value of 0.12 μm. This value is one tenth or less than that of a conventionally prepared Y-Ba-Cu-O type bulk superconductor.

Further, as results of transmission electron microscopy and energy dispersive X-ray spectrometry of the sample, it was confirmed that the fine RE211 phase principally comprises Gd211.

Comparative Example 1

Starting powders of $Nd_2O_3$, $BaCO_3$ and CuO were weighed and mixed in the ratio of Nd:Ba:Cu=1.8:2.4:3.4, followed by addition of 0.4% by weight of Pt and calcination at temperature of 900° C. for 8 hours in an 1%—oxygen atmosphere.

Then, the calcined material was further ground and mixed, and similar calcination as described above was repeated three times to form a pellet of 3 cm in diameter and 2 cm in height.

A single crystal of MgO was put on the thus formed pellet, heated up to temperature of 1,100° C. for 2 hours in an 1%—oxygen atmosphere, after keeping this condition for 20 minutes, cooled to temperature of 1,030° C. at a cooling rate of 5° C./hr., and then slowly cooled to 900° C. at a cooling rate of 0.5° C. to solidify and grow a superconductive phase.

The pellet was subsequently subjected to an oxygen treatment by slowly cooling it from temperature of 600° C. to 300° C. for 300 hours in a pure oxygen flow.

A small cubic sample of 2 mm×2 mm×1 mm was cut out from the pellet after the oxygen treatment and subjected to determination of critical current density by means of a superconductive quantum interference fluxmeter. The critical temperature was 94.5 K, while the critical current density was 10,000 A/cm$^2$ under a condition where a magnetic field of 3T was impressed parallel to the c axis at liquid nitrogen temperature.

After polishing the surface of the specimen (small cubic sample), average particle size of RE211 phase was determined by scanning electron microscopy to obtain a value of 5 μm.

Comparative Example 2

Starting powders of $Sm_2O_3$, $BaCO_3$ and CuO were weighed and mixed in the ratio of Sm:Ba:Cu=1.8:2.4:3.4, followed by addition of 0.4% by weight of Pt and calcination at temperature of 900° C. for 8 hours in an 1%—oxygen atmosphere.

Then, the calcined material was further ground and mixed, and similar calcination as described above was repeated three times to form a pellet of 3 cm in diameter and 2 cm in height.

A single crystal of MgO was put on the thus formed pellet, heated up to temperature of 1,080° C. for 2 hours in an 1%—oxygen atmosphere, after keeping this condition for 20 minutes, cooled to temperature of 1,020° C. at a cooling rate of 5° C./hr., and then slowly cooled to 950° C. at a cooling rate of 0.5° C. to solidify and grow a superconductive phase.

The pellet was subsequently subjected to an oxygen treatment by slowly cooling it from temperature of 600° C. to 300° C. for 300 hours in a pure oxygen flow.

A small cubic sample of 2 mm×2 mm×1 mm was cut out from the pellet after the oxygen treatment and subjected to determination of critical current density by means of a superconductive quantum interference fluxmeter. The critical temperature was 94 K, while the critical current density was 8,000 A/cm$^2$ under a condition where a magnetic field of 3T was impressed parallel to the c axis at liquid nitrogen temperature.

After polishing the surface of the specimen (small cubic sample), average particle size of RE211 phase was determined by scanning electron microscopy to obtain a value of 3 μm.

EXAMPLE 3

Starting powders of $Nd_2O_3$, $Eu_2O_3$, $Gd_2O_3$, $BaCO_3$ and CuO were weighed and mixed in the ratio of (Nd+Eu+Gd):Ba:Cu=1.8:2.4:3.4 and ND:Eu:Gd=1:1:1, followed by addition of 0.4% by weight of Pt and calcination at temperature of 950° C. for 8 hours in an 1%—oxygen atmosphere.

Then, the calcined material was further ground and mixed, and similar calcination as described above was repeated three times to form a pellet of 3 cm in diameter and 2 cm in height.

A single crystal of MgO was put on the thus formed pellet, heated up to temperature of 1,100° C. for 2 hours in an 1%—oxygen atmosphere, after keeping this condition for 20 minutes, cooled to temperature of 1,030° C. at a cooling rate of 5° C./hr., and then slowly cooled to 900° C. at a cooling rate of 0.5° C. to solidify and grow a superconductive phase.

The pellet was subsequently subjected to an oxygen treatment by slowly cooling it from temperature of 600° C. to 300° C. for 300 hours in a pure oxygen flow.

A small cubic sample of 2 mm×2 mm×1 mm was cut out from the pellet after the oxygen treatment and subjected to determination of critical current density by means of a superconductive quantum interference fluxmeter. The critical temperature was 95 K, while the critical current density was 80,000 A/cm$^2$ under a condition where a magnetic field of 3T was impressed parallel to the c axis at liquid nitrogen temperature.

After polishing the surface of the specimen (small cubic sample), average particle size of RE211 phase was determined by scanning electron microscopy to obtain a value of 0.08 μm. This value is one tenth or less than that of a conventionally prepared Y-Ba-Cu-O type bulk superconductor.

Further, as results of transmission electron microscopy and energy dispersive X-ray spectrometry of the sample, it was confirmed that the fine RE211 phase principally comprises Gd211 and (Gd, Eu)211.

EXAMPLE 4

Starting powders of $Nd_2O_3$, $Sm_2O_3$, $Gd_2O_3$, $BaCO_3$ and CuO were weighed and mixed in the ratio of (Nd+Sm+Gd):Ba:Cu=1.8:2.4:3.4 and ND:Sm:Gd=1:1:1, followed by calcination at temperature of 900° C. for 8 hours in an 1%—oxygen atmosphere.

Then, the calcined material was further ground and mixed, and similar calcination as described above was repeated three times to form a pellet of 3 cm in diameter and 2 cm in height.

A single crystal of MgO was put on the thus formed pellet, heated up to temperature of 1,100° C. for 2 hours in an 1%—oxygen atmosphere, after keeping this condition for 20 minutes, cooled to temperature of 1,030° C. at a cooling rate of 5° C./hr., and then slowly cooled to 900° C. at a cooling rate of 0.5° C. to solidify and grow a superconductive phase.

The pellet was subsequently subjected to an oxygen treatment by slowly cooling it from temperature of 600° C. to 300° C. for 300 hours in a pure oxygen flow.

A small cubic sample of 2 mm×2 mm×1 mm was cut out from the pellet after the oxygen treatment and subjected to determination of critical current density by means of a superconductive quantum interference fluxmeter. The critical temperature was 94 K, while critical current density was 35,000 A/cm$^2$ under a condition where a magnetic field of 3T was impressed parallel to the c axis at liquid nitrogen temperature.

After polishing the surface of the specimen (small cubic sample), average particle size of RE211 phase was determined by scanning electron microscopy to obtain a value of 0.3 μm. This value is smaller than that of a conventionally prepared Y-Ba-Cu-O type bulk superconductor, but larger than that of Pt-added samples. Thus, it is apparent that addition of Pt also contributes to fine dispersion of the RE211 phase.

EXAMPLE 5

Starting powders of $Sm_2O_3$, $Gd_2O_3$, $BaCO_3$ and CuO were weighed and mixed in the ratio of (Sm+Gd):Ba:Cu=1.8:2.4:3.4, and Sm:Gd=1:1, Sm:Gd=2:1 and Sm:Gd=1:2 to form three kinds of specimens, followed by addition of 0.4% by weight of Pt and calcination at temperature of 900° C. for 8 hours in an 1%—oxygen atmosphere.

Then, these calcined materials were further ground and mixed, and similar calcination as described above was repeated three times to form pellets of 3 cm in diameter and 2 cm in height.

A single crystal of MgO was put on each of the thus formed pellets, heated up to temperature of 1,080° C. for 2 hours in an 1%—oxygen atmosphere, after keeping this condition for 20 minutes, cooled to temperature of 1,020° C. at a cooling rate of 5° C./hr., and then slowly cooled to 900° C. at a cooling rate of 0.5° C. to solidify and grow a superconductive phase.

The pellets were subsequently subjected to an oxygen treatment by slowly cooling it from temperature of 600° C. to 300° C. for 300 hours in a pure oxygen flow.

Small cubic samples of 2 mm×2 mm×1 mm were cut out from the pellet after the oxygen treatment and subjected to determination of critical current density by means of a superconductive quantum interference fluxmeter. The critical temperature of three specimens (small cubic samples) was 94 K, while the critical current density thereof was 40,000, 32,000 and 15,000 A/cm$^2$ under a condition where a magnetic field of 3T was impressed parallel to the c axis at liquid nitrogen temperature in cases of "Sm:Gd ratio" of 2:1, 1:1 and 1:2, respectively.

After polishing the surface of the specimens (small cubic samples), average particle size of each RE211 phase was determined by scanning electron microscopy to obtain value of 0.2, 0.35 and 0.5 $\mu$m.

Such a change in the average particle size depends on a fact that a fine dispersing effect is decreased as Gd concentration is increased.

As has been described above, the present invention provides RE-Ba-Cu-O oxide superconductors in which a fine RE211 phase of 0.5 $\mu$m or less in particle size is dispersed in a RE123 superconductive parent phase to exhibit very high critical density even in a strong magnetic field as 3T under a condition where the magnetic field is impressed parallel to the c axis at liquid nitrogen temperature. The present superconductors will result in industrially useful effects, and makes it possible to develop a wide range of application of RE-Ba-Cu-O oxide superconductors including practical use for a magnetic levitation train in near future.

What is claimed is:

1. RE-Ba-Cu-O oxide bulk superconductors of high critical current density, wherein RE is a combination of two or more elements selected from La, Nd, Sm, Eu and Gd, at least one of them being La, Nd and Sm and the remainder being Eu or Gd, in which a parent phase thereof comprises a $RE_{1+x}Ba_{2-x}Cu_3O_y$ crystal wherein $-0.1<x<0.2$ and $6.7<y<7.1$, and 5 to 50% by volume of a $RE_2Ba_2CuO_5$ fine dispersed phase having particle size of 0.01 to 0.5 $\mu$m.

2. Oxide superconductors of high critical current density claimed in claim 1 in which a $RE_2Ba_2CuO_5$ fine dispersed phase comprises a fine crystal of $Gd_2BaCuO_5$, $Eu_2BaCuO_5$ or $(Eu, GD)_2BaCuO_5$.

3. Oxide superconductors of high critical current density claimed in claim 1 in which a RE site of RE-Ba-Cu-O bulk superconductors is a combination of three or more elements selected from La, Nd, Sm Eu or Gd.

4. Oxide superconductors of high critical current density claimed in claim 3 in which content of one or both of Eu and Gd in a RE site is 40% by volume or less.

5. Oxide superconductors of high critical current density claimed in claim 1 which further comprises 0.1 to 2% by weight of Pt.

6. Oxide superconductors of high critical current density claimed in claim 1 in which critical current density thereof at liquid nitrogen temperature is 10,000 A/cm$^2$ or more under a condition where a magnetic field of 3T is impressed parallel to c axis of a crystal.

* * * * *

UNITED STATES PATENT AND TRADEMARK OFFICE
CERTIFICATE OF CORRECTION

PATENT NO. : 6 063 736
DATED : May 16, 2000
INVENTORS : Muralidar MIRYARA et al

It is certified that error appears in the above-identified patent and that said Letters Patent are hereby corrected as shown below:

Column 10, line 8; change "$RE_2Ba_2CuO_5$" to ---$RE_2BaCuO_5$---.

line 11; change "$RE_2Ba_2CuO_5$" to ---$RE_2BaCuO_5$---.

Signed and Sealed this

First Day of May, 2001

Attest:

NICHOLAS P. GODICI

Attesting Officer

Acting Director of the United States Patent and Trademark Office